United States Patent
Hetzler

(10) Patent No.: US 6,946,845 B2
(45) Date of Patent: Sep. 20, 2005

(54) CURRENT, VOLTAGE AND TEMPERATURE MEASURING CIRCUIT

(75) Inventor: Ullrich Hetzler, Dillenburg-Oberscheld (DE)

(73) Assignee: Isabellenhutte Heusler GmbH KG, Dillenburg (DE)

( * ) Notice: Subject to any disclaimer, the term of this patent is extended or adjusted under 35 U.S.C. 154(b) by 138 days.

(21) Appl. No.: 10/431,292

(22) Filed: May 7, 2003

(65) Prior Publication Data

US 2003/0222511 A1 Dec. 4, 2003

(30) Foreign Application Priority Data

May 14, 2002 (DE) .......................................... 102 21 426
Aug. 13, 2002 (DE) .......................................... 102 37 126

(51) Int. Cl.⁷ .............................................. G01R 31/08
(52) U.S. Cl. ..................................................... 324/522
(58) Field of Search .......................... 702/189; 324/522, 324/429–433, 426

(56) References Cited

U.S. PATENT DOCUMENTS

| | | | |
|---|---|---|---|
| 3,344,406 A | 9/1967 | Vinal | |
| 3,992,617 A | 11/1976 | Epstein | |
| 4,694,384 A | 9/1987 | Steigerwald et al. | |
| 5,287,107 A | * 2/1994 | Gampell et al. | ............ 341/137 |
| 5,339,018 A | * 8/1994 | Brokaw | ...................... 320/147 |
| 5,869,951 A | * 2/1999 | Takahashi | .................... 320/104 |
| 6,324,042 B1 | * 11/2001 | Andrews | ................... 361/93.2 |

FOREIGN PATENT DOCUMENTS

DE   2451281   5/1976

* cited by examiner

*Primary Examiner*—Anjan Deb
*Assistant Examiner*—Amy He
(74) *Attorney, Agent, or Firm*—Ryndak & Suri; Vangelis Economou

(57) ABSTRACT

An ASIC for current, voltage and temperature measurements has signal inputs (RSHH, VBAT, ETS, ETR) for receiving input signals, several choppers, an amplifier, an analog/digital converter and a digital signal output for outputting the result of the measurement and for communicating with a higher-order control unit. The invention proposes that the measuring circuit contain several differential signal inputs (RSHH-RSHL, VBAT-RSHL, ETS-RSHL, ETR-RSHL and VBAT-ETS), wherein one respective chopper/multiplexer is arranged downstream of each signal input.

21 Claims, 1 Drawing Sheet

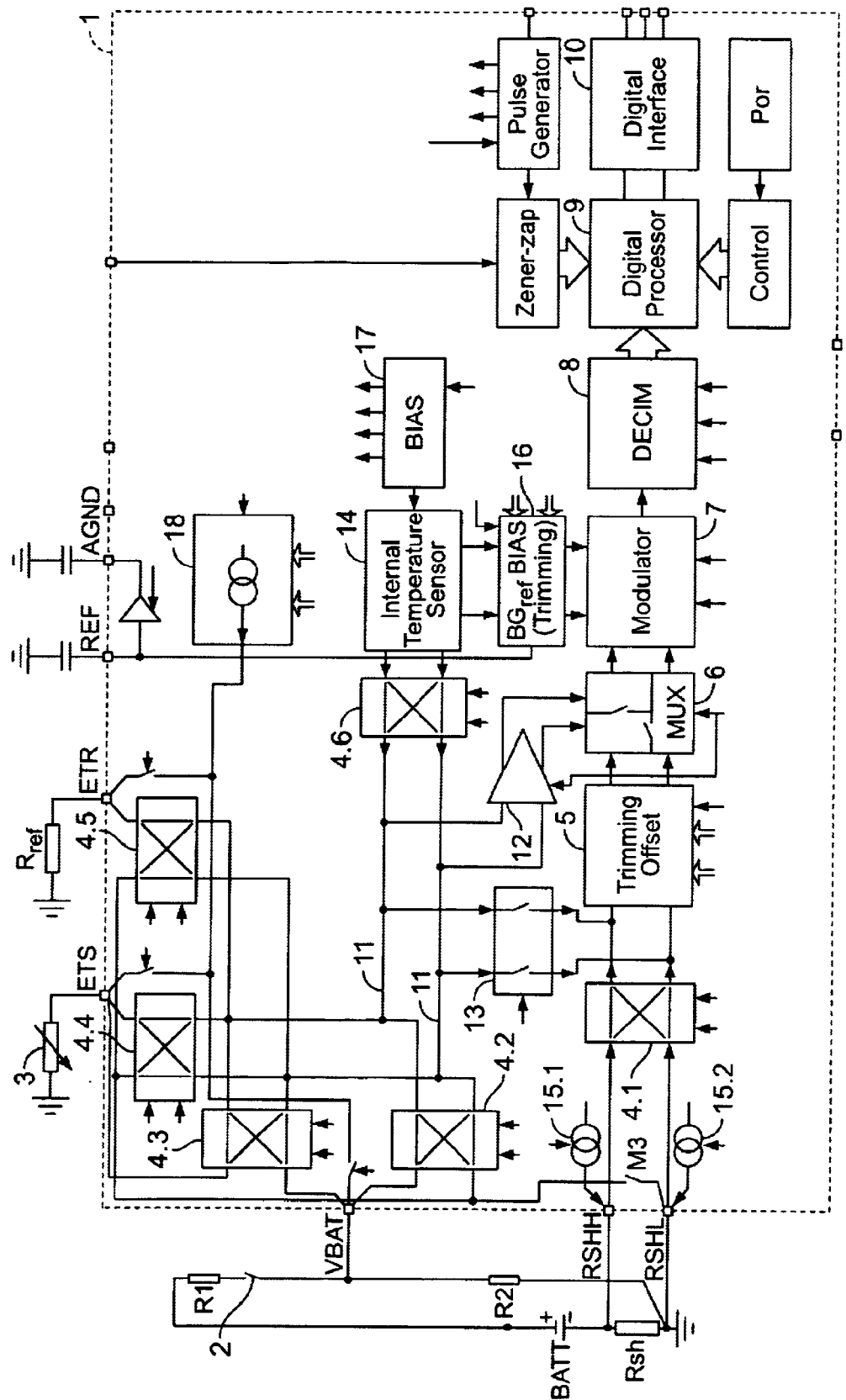
Figure

CURRENT, VOLTAGE AND TEMPERATURE MEASURING CIRCUIT

BACKGROUND OF THE INVENTION

The invention pertains to a measuring circuit, in particular, an ASIC for current, voltage and temperature measurements (e.g., in an on-board network of a motor vehicle) according to the preamble of claim 1.

Commonly invented EP 1 030 185 A2 and U.S. Pat. No. 6,489,693 B1 disclose a measuring circuit in the form of an ASIC (Application-Specific Integrated Circuit), which monitors the current in the on-board network of a motor vehicle in order to identify defective loads or to detect a battery overload.

So-called chopper amplifiers, among other devices, are used for measuring analog signals. These chopper amplifiers make it possible to reduce the input voltage offset and its temperature drift, as well as low-frequency noise. Chopper amplifiers of this type consist of a chopper on the input side, a downstream amplifier, and a demodulator on the output side which rectifies the chopped and amplified measuring signal phase-synchronously.

The disadvantages of known chopper amplifier circuits can be seen in the unsatisfactory noise behavior, the incomplete suppression of the input offset voltage and the fact that these circuits are only available in the form of separate amplifier circuits.

BRIEF SUMMARY OF THE INVENTION

Consequently, the invention is based on the objective of integrating a physically optimized chopper amplifier circuit for several input channels that are connected in series with a common output circuit in the digital environment of an analog/digital converter in such a way that the digital section does not have any disadvantageous effects on the amplifier and the demodulation takes place digitally.

Based on the initially described chopper amplifier circuit, this objective is realized with the characteristics of a measuring circuit for current and voltage measurements, with a signal input (RSHH, VBAT, ETS, ETR) for receiving an input signal, chopper means, an amplifier, a digital signal processor containing a digital demodulator and an analog/digital converter arranged between the amplifier and the demodulator, and a signal output for outputting an output signal. The circuit includes a plurality of signal inputs (RSHH, VBAT, ETS, ETR) for respectively receiving an input signal, all the input signals being measured in reference to a common reference potential (RSHL), wherein one respective chopper is arranged downstream of each signal input (RSHH, VBAT, ETS, ETR).

In a chopper amplifier with several signal inputs, the invention comprises the general technical teaching of providing one respective chopper for each individual signal input. The input signals can be measured in reference to a common reference potential. In one embodiment of the measuring circuit according to the invention, which is realized in the form of an integrated circuit, the individual choppers preferably are arranged directly on the input contact of the chip together with the respective input protection circuit in order to optimize the chopping effect.

In a preferred embodiment of the invention, the measuring circuit also contains a temperature sensor in order to compensate for the temperature-dependence of the measurement. Here, a separate chopper preferably is also arranged downstream of the temperature sensor.

It is preferred that the chopper simultaneously form the respective multiplexer for delivering the measuring signal to the voltage bus. The signal is supplied to the amplifier or A/D converter from the voltage bus by means of additional multiplexer circuits.

In a preferred embodiment of the invention, an analog/digital converter is arranged between the amplifier and the demodulator, wherein said converter converts the amplified chopper signal into a digital signal such that the subsequent demodulation can take place digitally.

An analog/digital converter of this type preferably contains a filter with a programmable order number, wherein the oversampling ratio and the oversampling clock frequency of the analog/digital converter preferably can also be adjusted in addition to the order number.

According to one embodiment of the invention, the line layout for all input signals is made bipolar so as to allow for differential measurements. This makes it possible to reduce offset, drift, noise and interference. The entire line layout between the signal input and the chopper, between the chopper and the amplifier, and between the amplifier and the A/D converter is thus preferably made bipolar, where closely spaced conductor traces are preferably used.

According to one preferred embodiment of the invention, a sigma/delta converter is arranged downstream of the amplifier, where said converter converts the chopped, amplified measuring signal into a digital signal.

In addition, a sensor breakage detector which detects an interruption in the measuring lines and sensors connected to the input side is preferably provided. A controllable current source that can be connected to at least one of the signal inputs is preferably provided for this purpose. A voltage measurement on the respective signal input makes it possible to determine whether the measuring lines and sensors connected to the input side are interrupted.

The invention is particularly suitable for measuring very small bipolar signals and provides the advantage that, in contrast to comparable types of known converters, no additional pre-amplifiers and multiplexers are required for processing similarly low voltages.

Other advantageous additional developments of the invention are defined in the dependent claims or are described in greater detail below with reference to the preferred embodiment of the invention that is illustrated in the figures. The figure shows one preferred embodiment of the measuring circuit according to the invention in the form of a block diagram.

BRIEF DESCRIPTION OF THE DRAWING FIGURE

The FIGURE is a block diagram illustrating the circuit of the present invention.

DETAILED DESCRIPTION OF THE PREFERRED EMBODIMENTS

The block diagram in the FIGURE illustrates the circuit design of the measuring circuit 1 according to the invention which can be used for current monitoring purposes in the on-board network of a motor vehicle.

The on-board network of a motor vehicle is illustrated schematically merely in the form of a battery BATT, two resistors R1, R2, a switching element 2 and a precision resistor Rsh, where the voltage drop across the precision resistor Rsh represents the current in the on-board network of the motor vehicle.

This is the reason the measuring circuit 1 comprises two signal inputs, RSHH and RSHL, that allow a differential voltage measurement across the precision resistor Rsh and that are thus connected to the two terminals of the precision resistor Rsh.

The measuring circuit 1 also contains a battery voltage input VBAT that is connected to the connection point between the switching element 2 and the resistor R2 of the on-board network of the motor vehicle.

The measuring circuit 1 also contains a signal input ETS, to which a sensor 3 with a variable resistor is connected.

In addition, the measuring circuit 1 contains a signal input ETR that is connected to the ground via a resistor Rref.

The sensors/resistors connected to the inputs VBAT, ETS and ETR can be activated by the measuring circuit via an installed current source 18 that can be connected to each input, wherein the current source is programmable and also digitally controllable. The voltage drop thereby induced can then be measured at the same input in the form of a sensor signal.

The individual signal inputs RSHL, RSHH, VBAT, ETS and ETR are respectively connected to choppers 4.1–4.5 that operate at a frequency of 20 kHz. The individual choppers 4.1–4.5 contain the input protection circuit and the input multiplexers. They are arranged directly on the contacts of the signal inputs RSHL, RSHH, VBAT, ETS and ETR on the chip of the measuring circuit 1 in order to optimize the offset suppression and the noise behavior.

The input of the chopper 4.1 is directly connected to the two signal inputs RSHH and RSHL via a bipolar connection, wherein the bipolar line system reduces offset, drift and noise, as well as the sensitivity to external interference fields (EMV sensitivity).

The chopper 4.3 is directly connected to the two signal inputs VBAT and ETS via a bipolar line, wherein the choppers 4.2, 4.4 and 4.5 are connected via a common ground line and a switching element M3 to a common reference potential point (ground at RSHL) to which all signal inputs are in reference.

The output of the chopper 4.1 is connected to an amplifier 5, wherein the gain of amplifier 5 is programmable.

The outputs of the other choppers 4.2–4.5 are connected to a bipolar voltage bus 11, which, in turn, is connected to a multiplexer 6 via an amplifier 12 (buffer). Thus the multiplexer 6 is able to either forward to the modulator 7 the signal of the chopper 4.1, which was amplified by the amplifier 5, or the signal of one of the choppers 4.2–4.5, which is applied to the voltage bus 11.

In addition, the voltage bus 11 is connected to the input of the amplifier 5 via an additional multiplexer 13. Thus the input of the amplifier 5 is able to receive either the signal of the chopper 4.1 or the signal applied to the voltage bus 11.

A digital section of the circuit has a control mode that makes it possible to change over between these two input channels of the amplifier very rapidly such that a quasi 2-channel measurement is achieved with only one A/D converter. The automatic change-over takes place between the current measurement (chopper 4.1) and a measurement on the voltage bus (choppers 4.2–4.6). The measuring parameters (amplification, measuring speed, channel and the like) are selected and adjusted before the measurement begins by writing to the internal registers in the digital section.

The measuring circuit 1 also contains a temperature sensor 14, the output of which is connected to an additional chopper 4.6. Here, the output of the chopper 4.6 is connected to the voltage bus 11.

The output of the amplifier 5 is connected to a sigma/delta converter consisting of a modulator 7 and a decimator 8 via the multiplexer 6, where the output of said converter delivers a digital signal to a digital circuit 9. The demodulation or the dechopping takes place in the digital section, not in the analog section of the circuit as is the case with conventional chopper amplifiers.

During a measuring cycle, four (or eight) measurements are carried out in each polarity of the multiplexer, wherein only the last value is used for the digital calculation of the offset-compensated measurement value which completely avoids transient phenomena. An updated and fully offset-compensated measuring value is available after the usual conversion time during continuous measurements because the last given measured value with the other sign can be used for the digital calculation.

The digital circuit 9 is also connected to a digital interface 10 for outputting the measurement signal.

The measuring circuit 1 also makes it possible to detect an interruption or breakage of the connecting lines connected to the two signal inputs RSHH and RSHL. For this purpose, the measuring circuit 1 contains two switchable current sources, 15.1 and 15.2, that are connected to the two signal inputs RSHH and RSHL and able to deliver a measuring current. It can be determined whether the connecting lines are interrupted or defective by measuring the differential voltage at the two signal inputs RSHH and RSHL.

Analogously, the connecting lines on the inputs VBAT, ETR and ETS can be checked for breaks by connecting the internal current source 18.

In addition, the measuring circuit 1 allows an analog offset of the input signal to approximately half the supply voltage. Thus, input voltages with positive and negative values of up to +/−0.7 V can be measured with equal accuracy. For this purpose, the measuring circuit 1 contains a trimming circuit 16 and 17, the output of which is connected to the modulator 7 and the input of which is connected to a reference input REF and an analog ground input AGND.

This circuit also has a precision reference voltage, the absolute value and temperature coefficient of which can be trimmed by means of the digital interface.

The measuring circuit also has a so-called "sleep mode," in which all functional groups are switched off in order to reduce current consumption. In this case, the supply current is less than 100 $\mu$A.

One unusual feature is the "active wake-up mode" that can be activated in this mode. Here, the measuring circuit is activated and a preprogrammed measurement is carried out approximately once per second by means of an internal oscillator/timer located in the digital section. If it is determined that an also preprogrammed limit value is exceeded during these measurements, an output line is activated that makes it possible to wake up an external higher-order electronic module. If no defect is detected, the circuit returns to "sleep mode" until the next activation.

The previously described measuring circuit can be used advantageously for measuring the total current flowing from a motor vehicle battery to the connected loads and/or the charge current of the motor vehicle battery in order to monitor the individual loads as described in EP 1 030 185 A and U.S. Pat. No. 6,489,693 B1, and to control the battery currents in the sense of extending the service life of the motor vehicle battery.

The disclosure of U.S. Pat. No. 6,489,693 is incorporated herein by reference. The measuring circuit 1 accordingly may be disposed on the surface of a measuring resistor, such as resistor Rsh, which is made of a metal alloy.

The invention is not limited to the above-described ASIC that represents the preferred embodiment. On the contrary, it would be conceivable to realize numerous variations and modifications that also employ the invention and that thus fall under its scope of protection of, and are limited only by, the following claims.

What is claimed is:

1. Measuring circuit for current and voltage measurements, with a signal input (RSHH, VBAT, ETS, ETR) for receiving an input signal, chopper means, an amplifier, a digital signal processor containing a digital demodulator and an analog/digital converter arranged between the amplifier and the demodulator, and a signal output for outputting an output signal, characterized by a plurality of signal inputs (RSHH, VBAT, ETS, ETR) for respectively receiving an input signal, all said input signals being measured in reference to a common reference potential (RSHL), wherein one respective chopper is arranged downstream of each signal input (RSHH, VBAT, ETS, ETR).

2. Measuring circuit according to claim 1, further comprising control means for automatically switching over said amplifier between two input channels so that two different input signals to be measured can be applied to said amplifier.

3. Measuring circuit according to claim 2, wherein one of said different input signals is a current signal and the other input signal is a voltage signal.

4. Measuring circuit according to claim 1, wherein a temperature sensor is provided for measuring the temperature, wherein a chopper is arranged downstream of the temperature sensor.

5. Measuring circuit according to claim 1, wherein the analog/digital converter includes a filter with a programmable order number.

6. Measuring circuit according to claim 1, further comprising a digital interface for adjusting at least one operating parameter of the measuring circuit.

7. Measuring circuit according to claim 6, wherein the adjustable operating parameter is an absolute value and/or a temperature coefficient of a reference voltage.

8. Measuring circuit according to claim 1, further comprising an oscillator and/or a timer for internally generating clock signals.

9. Measuring circuit according to claim 1, further comprising an operating mode in which the measuring circuit carries out a measurement within predetermined time intervals, checks whether a predetermined threshold value has been exceeded, and, if so required, activates an external device.

10. Measuring circuit according to claim 1, wherein the measuring circuit comprises an integrated circuit.

11. Measuring circuit according to claim 10, further including a measuring resistor (Rsh) connected to at least one of said signal inputs (RSHH), and wherein said integrated circuit is mounted on said measuring resistor.

12. Measuring circuit for current and voltage measurements, with a signal input (RSHH, VBAT, ETS, ETR) for receiving an input signal, chopper means, an amplifier, a digital signal processor and a signal output for outputting an output signal, characterized by a plurality of signal inputs (RSHH, VBAT, ETS, ETR) for respectively receiving an input signal, all said input signals being measured in reference to a common reference potential (RSHL), wherein one respective chopper is arranged downstream of each signal input (RSHH, VBAT, ETS, ETR) wherein each signal input has its own chopper which can be activated separately and can be connected to the amplifier or to the analog/digital converter by itself acting as a multiplexer or by separate multiplexer means.

13. Measuring circuit according to claim 1, wherein said chopper means further comprises several choppers which are interconnected via a voltage bus.

14. Measuring circuit according to claim 1, further comprising a bipolar line system between the signal inputs (RSHH-RSHL, VBAT-RSHL, ETS-RSHL and ETR-RSHL, and VBAT-ETS) and the chopper and/or between the chopper and the amplifier and/or between the amplifier and the demodulator and/or between the demodulator and the signal output.

15. Measuring circuit according to claim 1, wherein a sigma/delta modulator is arranged downstream of the amplifier.

16. Measuring circuit according to claim 1, further comprising a first controllable current source that can be connected to at least one of the signal inputs (RSHH, RSHL).

17. Measuring circuit according to claim 16, further comprising a second controllable current source that can be connected to at least one of the outputs (ETR, ETS and VBAT) in order to activate external sensors.

18. Measuring circuit according to claim 12, wherein the chopper, the amplifier, the digital signal processor, the multiplexer and/or the analog/digital converter can be switched off in order to reduce the current consumption.

19. Measuring circuit for current and voltage measurements, with a signal input (RSHH, VBAT, ETS, ETR) for receiving an input signal, chopper means, an amplifier, a digital signal processor and a signal output for outputting an output signal, a plurality of signal inputs (RSHH, VBAT, ETS, ETR) for respectively receiving an input signal, all said input signals being measured in reference to a common reference potential (RSHL), wherein one respective chopper is arranged downstream of each signal input (RSHH, VBAT, ETS, ETR), control means for automatically switching over said amplifier between two input channels so that two different input signals to be measured can be applied to said amplifier, wherein one of said different input signals is a current signal and the other input signal is a voltage signal, and the gain of the amplifier is adjustable.

20. Measuring circuit for current and voltage measurements, with a signal input (RSHH, VBAT, ETS, ETR) for receiving an input signal, chopper means, an amplifier, a digital signal processor and a signal output for outputting an output signal, a plurality of signal inputs (RSHH, VBAT, ETS, ETR) for respectively receiving an input signal, all said input signals being measured in reference to a common reference potential (RSHL), wherein one respective chopper is arranged downstream of each signal input (RSHH, VBAT, ETS, ETR), control means for automatically switching over said amplifier between two input channels so that two different input signals to be measured can be applied to said amplifier, wherein one of said different input signals is a current signal and the other input signal is a voltage signal, and the chopper operates at a frequency between approximately 5 and approximately 50 kHz.

21. Measuring circuit according to claim 20, wherein the chopper operates at a frequency of approximately 20 kHz.

* * * * *